(12) United States Patent
Lai

(10) Patent No.: US 8,238,974 B2
(45) Date of Patent: Aug. 7, 2012

(54) DISPLAY MODULE FOR MOBILE COMMUNICATION DEVICE

(75) Inventor: Wei-Chih Lai, Kao Hsiung County (TW)

(73) Assignee: Orise Technology Co., Ltd., Hsinchu (TW)

( * ) Notice: Subject to any disclaimer, the term of this patent is extended or adjusted under 35 U.S.C. 154(b) by 154 days.

(21) Appl. No.: 12/830,884

(22) Filed: Jul. 6, 2010

(65) Prior Publication Data

US 2011/0009168 A1   Jan. 13, 2011

(30) Foreign Application Priority Data

Jul. 9, 2009   (TW) ............................... 98123165 A

(51) Int. Cl.
*H04B 1/38* (2006.01)
(52) U.S. Cl. ..................... 455/558; 455/575.1; 455/566; 349/1; 349/58; 349/60; 361/748; 361/749
(58) Field of Classification Search .................. 455/558, 455/575.1, 566; 349/1, 58, 60; 361/748, 361/749
See application file for complete search history.

(56) References Cited

U.S. PATENT DOCUMENTS

| | | | | |
|---|---|---|---|---|
| 5,831,836 A | * | 11/1998 | Long et al. | 361/820 |
| 6,014,317 A | * | 1/2000 | Sylvester | 361/760 |
| 7,885,079 B2 | * | 2/2011 | Chen et al. | 361/749 |
| 2009/0155610 A1 | * | 6/2009 | Kaneshiro et al. | 428/473.5 |

* cited by examiner

*Primary Examiner* — Barry W Taylor
(74) *Attorney, Agent, or Firm* — Muncy, Geissler, Olds & Lowe, PLLC

(57) ABSTRACT

An embodiment of the invention discloses an display module for mobile communication device which comprises a display panel, a flexible printed circuit board, an electronic component. The flexible printed circuit board is coupled to the display panel and is divided into a first portion and a second portion. The electronic component is disposed on a first surface of the flexible printed circuit board, and the location of the electronic component corresponds to that of the second portion of the flexible printed circuit board. The extensibility of the second portion of the flexible printed circuit board is smaller than that of the first portion of the flexible printed circuit board.

17 Claims, 9 Drawing Sheets

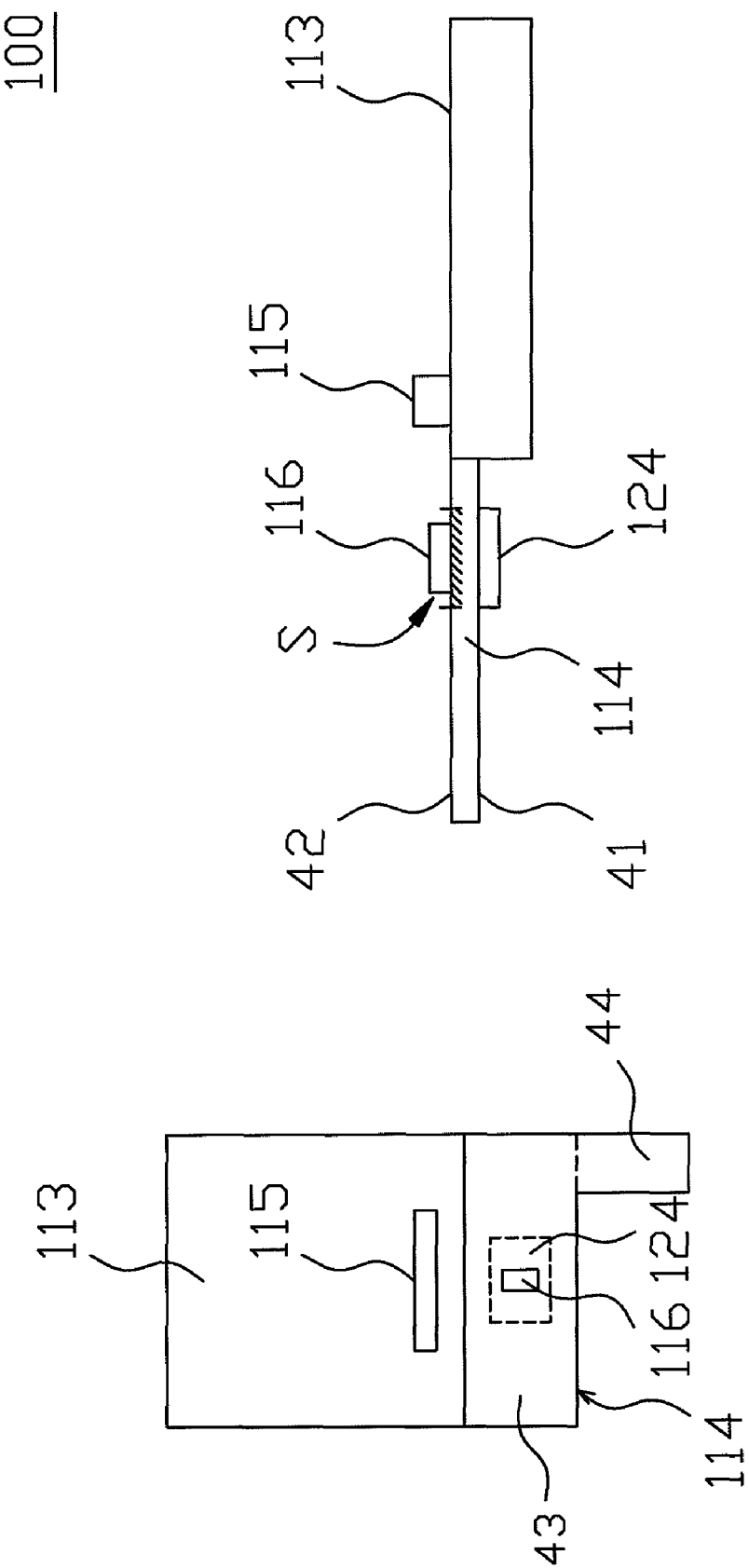

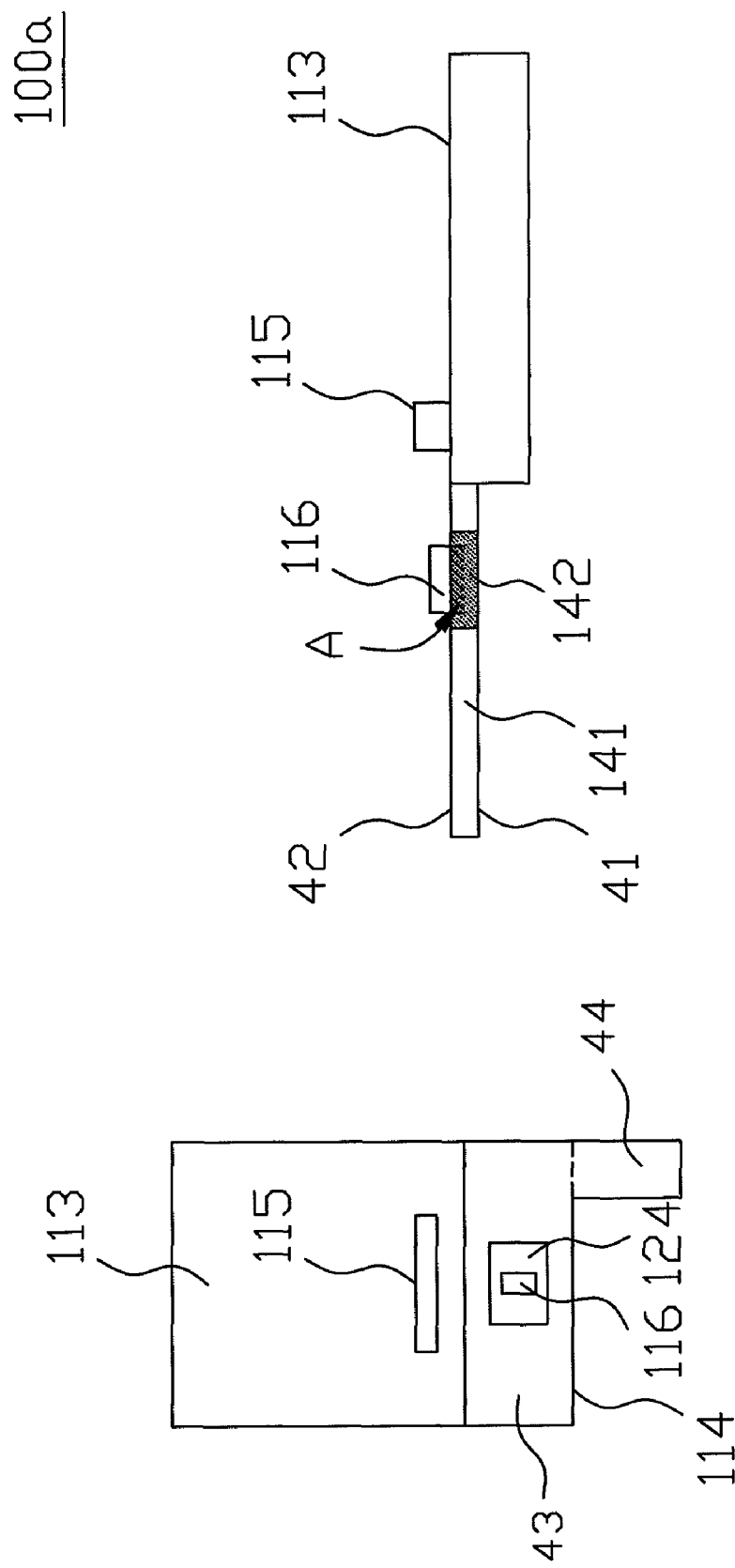

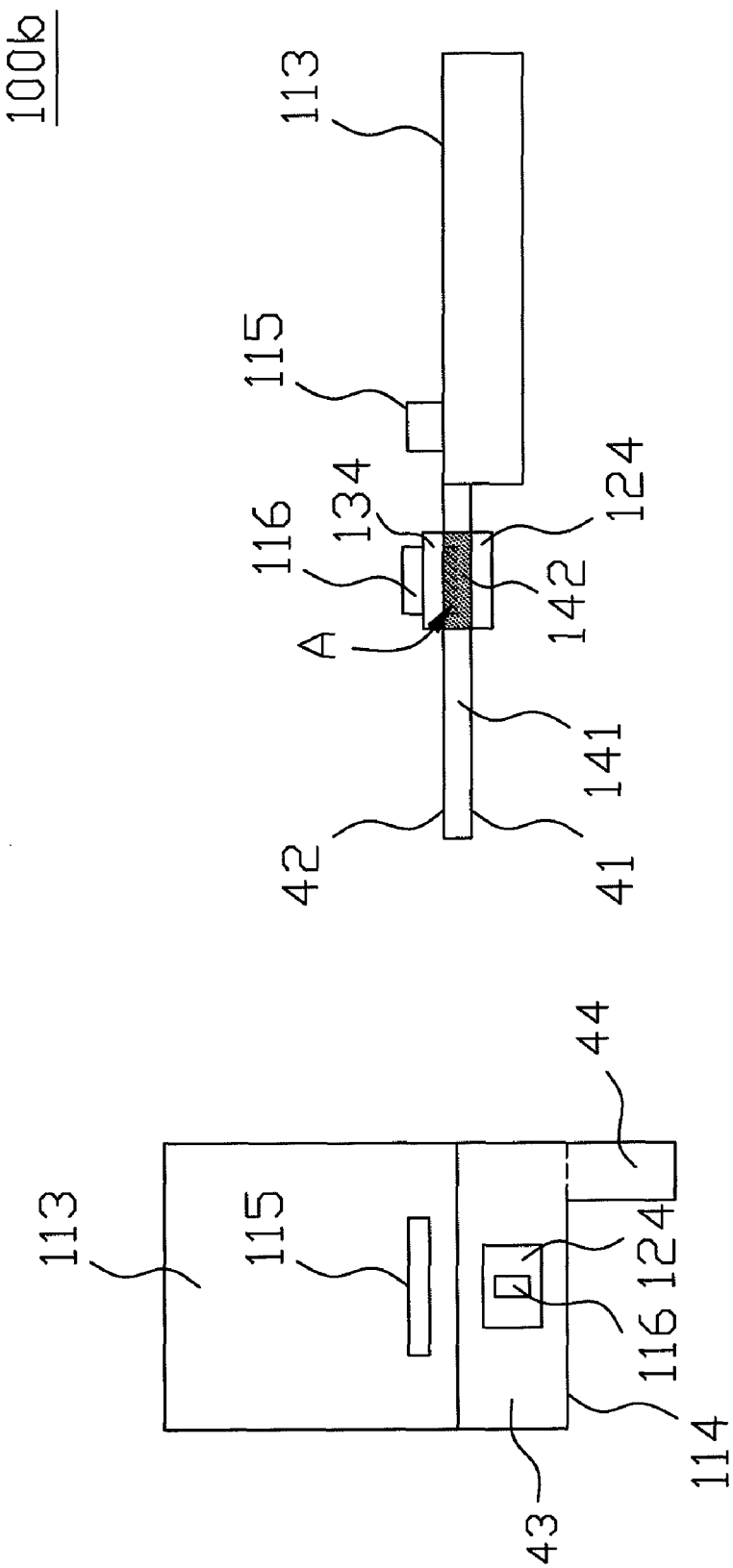

DISPLAY MODULE FOR MOBILE COMMUNICATION DEVICE

BACKGROUND OF THE INVENTION (a) Field of the Invention

The invention relates to a display module for a hand-held device, and more particularly, to a display module for a mobile communication device being capable of reducing noise.

(b) Description of the Related Art

FIG. 1 shows an exploded view illustrating a conventional display for a mobile communication device. In the conventional display for mobile communication device 10, a display module is disposed in space defined by a lower casing 11 and an upper casing 12. The display module comprises a display panel 13, a driver 15 and a flexible printed circuit board (FPCB) 14. The display panel 13 is driven by an external driving voltage. To drive the display panel 13, a driver 15 is disposed on the display panel 13 and a FPCB 14 is coupled to the display panel 13. On the FPCB 14, a plurality of electronic components is disposed such as resistances, capacitors, etc. A speaker 17 is disposed on the upper casing 12 so that a user can hear the voice from another person during communication. When a mobile communication device is in operation, since the ear of the user is very close to the speaker 17, the user is very sensitive to the noise generated by the display for mobile communication device 10. In general, the manufacturer of mobile communication device will make a request that the noise generated by the display module for mobile communication device 10 should be conform to their noise measurement specification.

FIGS. 2A to 2B show a schematic diagram illustrating how a conventional display for mobile communication device generates noise. In operation of a conventional display for mobile communication device, a driving voltage applied into the display panel 13 is continuously varied to change the direction of the liquid crystal molecules. However, the dielectric medium in the capacitor 16 on the FPCB 14 is influenced by the continuously varied voltage differences, which results in swelling or shrinking of the capacitor 16. Furthermore, the surface of the FPCB 14 may have swelling or shrinking deformation due to the swelling or shrinking of the capacitor 16. As shown in FIG. 2B, the FPCB 14 vibrates with the swelling or shrinking of the capacitor 16 since the electric field caused by the voltage difference is varied with time. If the resonance due to vibration of the FPCB 14 has a frequency falling within the range that can be sensed by human being, noise occurs.

In one conventional technique, the characteristics of the capacitor 16 is altered to reduce the degree of deformation of the capacitor 16 influenced by the driving voltage. However, due to rising scrutiny of the display quality of a display module and gradually strict tolerance of noise, the effect of reducing noise by altering the characteristics of the capacitor 16 is already unable to satisfy practical application. FIGS. 3A to 3B show a schematic diagram illustrating how a conventional display for mobile communication device generates noise. As shown in FIGS. 3A to 3B, the capacitors 16 are symmetrically disposed on the top and bottom surfaces of the FPCB 14 so that the vibration of the FPCB 14 is reduced to decrease formation of noise. It is difficult, however, to dispose the capacitors 16 on the top and bottom surfaces of the FPCB 14 during manufacturing, and the thick of the FPCB 14 becomes thicker. As a result, it is not easy to dispose the FPCB 14 into the lower casing 11 and the upper casing 12, and then increasing the manufacturing complexity.

BRIEF SUMMARY OF THE INVENTION

An embodiment of the invention is to provide an display module for mobile communication device which comprises a display panel, a flexible printed circuit board, an electronic component. The flexible printed circuit board is coupled to the display panel and includes a first portion and a second portion. The electronic component is disposed on a first surface of the flexible printed circuit board, and the location of the electronic component corresponds to the location of the second portion of the flexible printed circuit board. The extensibility of the second portion of the flexible printed circuit board is smaller the extensibility that of the first portion of the flexible printed circuit board.

An embodiment of the invention is to provide an display module for mobile communication device which comprises a display panel, a flexible printed circuit board, an electronic component and an anti-vibration layer. The flexible printed circuit board is coupled to the display panel and has a first surface and a second surface opposite the first surface. The electronic component is disposed on the first surface of the flexible printed circuit board. The anti-vibration layer is disposed on the second surface of the flexible printed circuit board, and the location of the anti-vibration layer corresponds to the location of the electronic component so that deformation of the electronic component is alleviated. Accordingly, the resonance due to vibration of the flexible printed circuit board is reduced.

According to an embodiment of the invention, the anti-vibration layer is disposed on the second surface of the flexible printed circuit board, and the electronic component is disposed on the first surface of the flexible printed circuit board. The location of the anti-vibration layer is set to correspond to the location of the electronic component so that the force due to deformation of the electronic component is alleviated. As a result, the resonance due to vibration of the flexible printed circuit board is reduced, and the effect of reducing noise is achieved.

Other objects and advantages of the invention can be better understood from the technical characteristics disclosed by the invention. In order to clarify the above mentioned and other objects and advantages of the invention, examples accompanying with figures are provided and described in details in the following.

BRIEF DESCRIPTION OF THE DRAWINGS

FIG. 4A shows a schematic top view of a display module for a mobile communication device according to one embodiment of the invention.

FIG. 4B shows a schematic side view of a display module for a mobile communication device according to one embodiment of the invention.

FIG. 6A shows a schematic top view of a display module for a mobile communication device according to one embodiment of the invention.

FIG. 6B shows a schematic side view of a display module for a mobile communication device according to one embodiment of the invention.

FIG. 7A shows a schematic top view of a display module for a mobile communication device according to one embodiment of the invention.

FIG. 7B shows a schematic side view of a display module for a mobile communication device according to one embodiment of the invention.

DETAILED DESCRIPTION OF THE INVENTION

Figure 1:
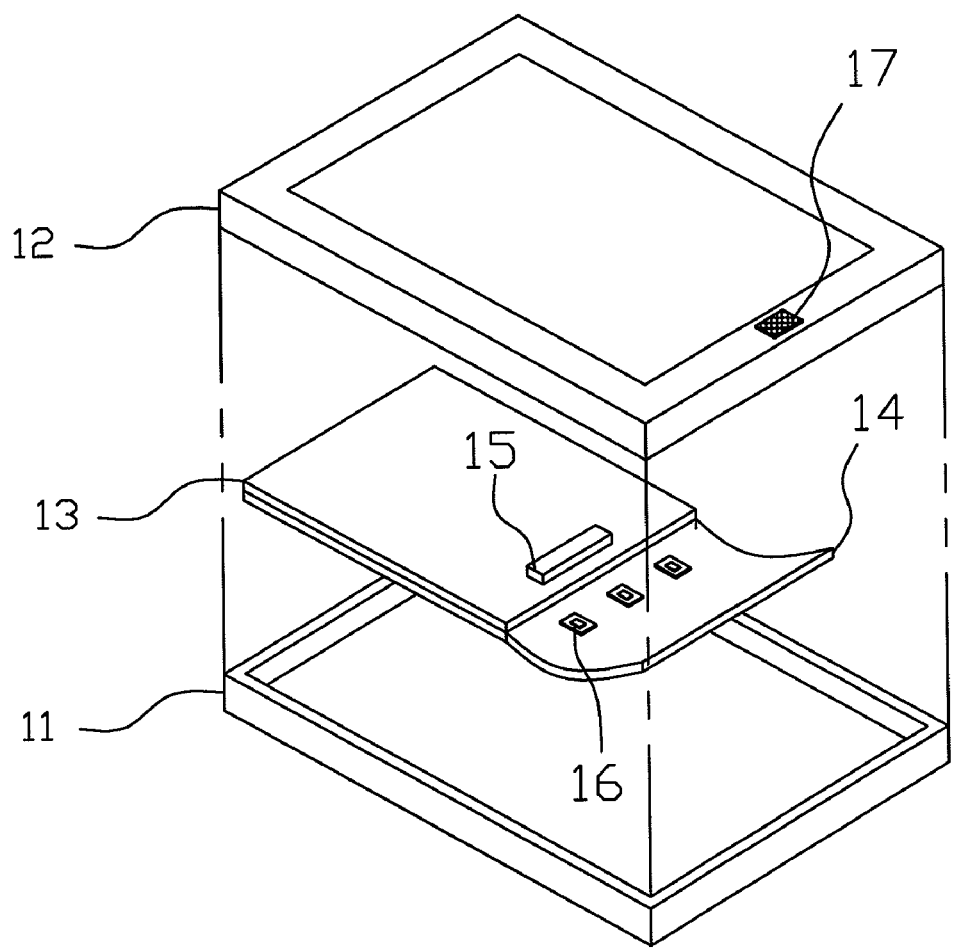
FIG. 1 shows an exploded view illustrating a conventional display module for a mobile communication device.
Figure 2A:
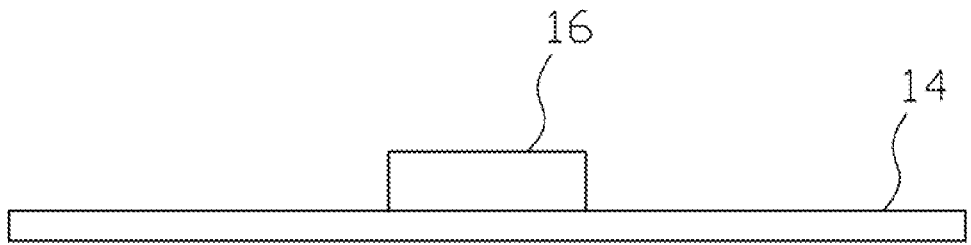
FIG. 2A shows a schematic diagram illustrating how a conventional display module for a mobile communication device generates noise.
Figure 2B:
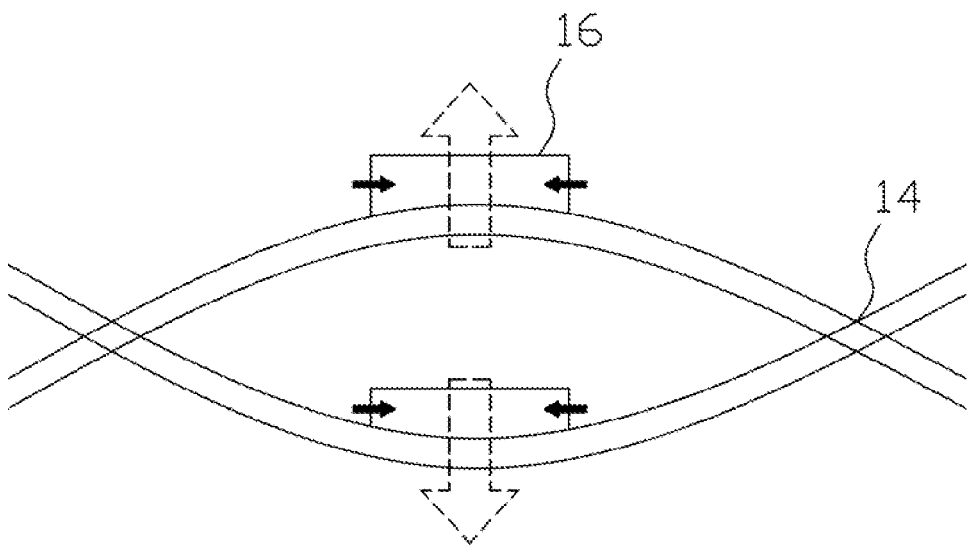
FIG. 2B shows a schematic diagram illustrating how a conventional display module for a mobile communication device generates noise.
Figure 3A:
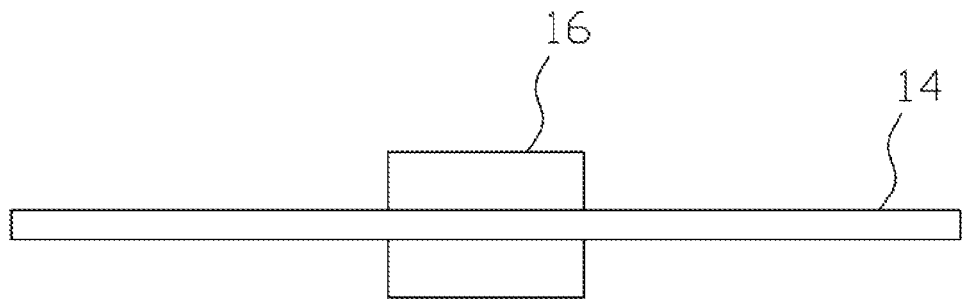
FIG. 3A shows a schematic diagram illustrating how a conventional display module for a mobile communication device generates noise.
Figure 3B:
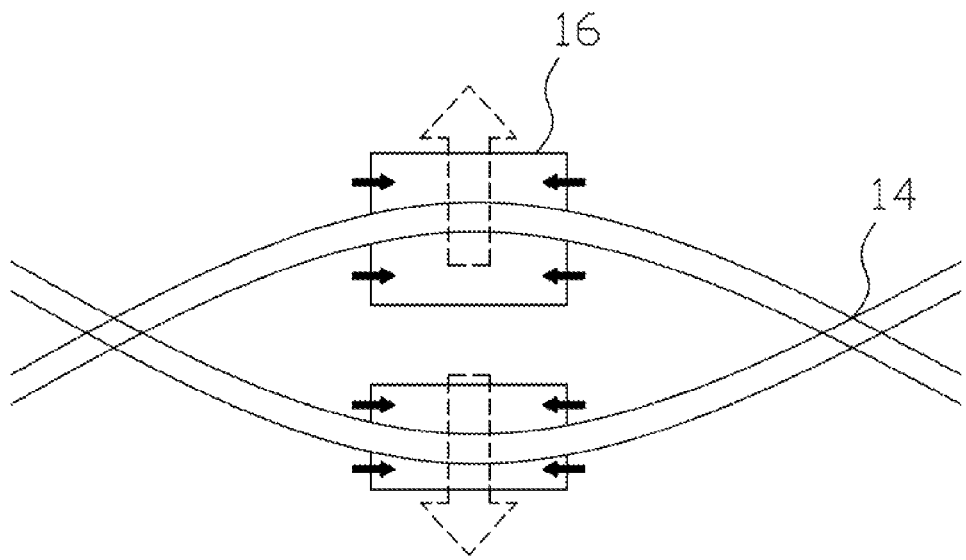
FIG. 3B shows a schematic diagram illustrating how a conventional display module for a mobile communication device generates noise.

The above and other technical content, characteristics, and functions of the invention will be described in details with reference to the drawings. For clarity, the wording related to direction, such as up, down, left, right, front, back, etc., used in examples is referred to the direction with respect to the drawings. Therefore, the wording related to direction is not used to limit the scope of the invention.

FIG. 4A shows a schematic top view of a display module for mobile communication device according to one embodiment of the invention. FIG. 4B shows a schematic side view of a display module for mobile communication device according to one embodiment of the invention. In one embodiment, a display module for mobile communication device 100 comprises a display panel 113, a FPCB 114, an electronic component 116 and at least one anti-vibration layer 124. In one embodiment, it may further comprise a driver 115.

The driver IC 115 is disposed on the display panel 113. The FPCB 114 is coupled to the display panel 113. In this embodiment, the FPCB 114 may be divided into a coupling portion 43 and a folded portion 44. The coupling portion 43 of the FPCB 114 is coupled to the display panel 113, and the other portion of the FPCB 114 is folded and forms the folded portion 44. The FPCB 114 has a first surface 42 and a second surface 41 opposite to the first surface 42. At least one electronic component 116 is disposed on the first surface 42 of the FPCB 114. The electronic component 116 may be a passive component, such as inductor, resistance and capacitor, and etc, and it may also be an active component, such as IC chip. The anti-vibration layer 124 is disposed on the second surface 41 of the FPCB 114. The location where the anti-vibration layer 124 is disposed corresponds to the location on the first surface 42 where the electronic component 116 is provided, or the former and the latter are at least partially overlapped. Specifically, the first surface 42 is substantially parallel to the second surface 41; the contact area between the electronic component 116 and the first surface 42 is at least partially overlapped into the orthographic projection area S of the anti-vibration layer 124 on the first surface 42 along the normal direction of the first surface 42. It is preferred that the contact area between the anti-vibration layer 124 and the second surface 41 is bigger than the contact area between the electronic component 116 and the first surface 42; the electronic component 116 is disposed in the orthographic projection area S of the anti-vibration layer 124 on the first surface 42 along the normal direction of the first surface 42.

In this embodiment, the anti-vibration layer 124 is disposed on the second surface 41 of the FPCB 114. Due to the deformation of the electronic component 116, a force parallel to the first surface 42 is exerted on the first surface 42 of the FPCB 114. In the display module for mobile communication device 100 according to this embodiment, the location of the anti-vibration layer 124 corresponds to that of the electronic component 116 so that the anti-vibration layer 124 may assist the FPCB 114 to resist the force caused by the deformation of the electronic component 116. Consequently, the display module for mobile communication device 100 may reduce the vibration of the FPCB 114 and then achieve effects of reducing noise.

Different examples listed in following table 1, table 3 and table 5 use different experiment conditions designed for different objects. The measurement results obtained from examples and comparative examples are recorded in following table 2, table 4 and table 6. The experiment conditions may include: experiment samples such as display module or display; type, location and occupying area of the anti-vibration layer 124; measurement background and the location of the electronic component 116 where noise is concentrated. As shown in the following tables, twin adhesive tapes may be twin super adhesive tapes made by DEER BRAND; against static electricity tapes may be the one made by TOYO; and 3M type may be Scotch Super Clear made by 3M.

TABLE 1

(Condition Of Experiment Object 1)

| Embodiment Of Anti-Vibration Layer | Measurement Sample | Display Condition | Type Of Anti-Vibration Layer | Location Of Anti-Vibration Layer | Occupying Area Of Anti-Vibration Layer |
|---|---|---|---|---|---|
| Comparative Example 1 | #1 | Best | — | — | — |
| Example 1 | #1 | Best | Twin Adhesive Tape | First Surface | Whole |
| Example 2 | #1 | Best | Twin Adhesive Tape | Second Surface | Whole |
| Example 3 | #1 | Best | 3M Tape | Second Surface | Whole |
| Example 4 | #1 | Best | Against Static Electricity Tape | Second Surface | Whole |
| Example 5 | #1 | Best | Twin Adhesive Tape | Second Surface | Partial |
| Comparative Example 2 | #2 | Best | — | — | — |
| Example 6 | #2 | Best | Against Static Electricity Tape | Second Surface | Whole |
| Comparative Example 3 | #3 | Best | — | — | — |
| Example 7 | #3 | Best | Twin Adhesive Tape | Second Surface | Partial |

TABLE 2

(Measurement Result Of Experiment Object 1)

| Measurement Sample | Display Condition | Embodiment Of Anti-Vibration Layer | Measurement Location | | | | | | | | |
|---|---|---|---|---|---|---|---|---|---|---|---|
| | | | P1 | P2 | P3 | P4 | P5 | P6 | P7 | P8 | P9 |
| #1 | Best | Comparative Example 1 | 11.10 | 9.23 | — | 0.31 | — | — | — | — | — |
| | | Example 1 | 15.50 | — | — | — | — | — | — | — | — |
| | | Example 2 | 6.49 | — | — | — | — | — | — | — | — |
| | | Example 3 | <0 | — | — | — | — | — | — | — | — |
| | | Example 4 | 8.56 | — | — | — | — | — | — | — | — |
| | | Example 5 | 6.69 | — | — | — | — | — | — | — | — |
| #2 | | Comparative Example 2 | 14.10 | — | — | — | — | — | — | — | — |
| | | Example 6 | 4.80 | — | — | — | — | — | — | — | — |
| #3 | | Comparative Example 3 | 14.90 | 16.60 | 6.84 | — | — | — | — | — | — |
| | | Example 7 | <0 | <0 | — | — | — | — | — | — | — |

TABLE 3

(Condition Of Experiment Object 2)

| Embodiment Of Anti-Vibration Layer | Measurement Sample | Display Condition | Anti-Vibration Layer Type | Anti-Vibration Layer Location | Anti-Vibration Layer Occupying Area |
|---|---|---|---|---|---|
| Comparative Example 4 | #4 | Best | — | — | — |
| Example 8 | #4 | Best | 3M Tape | Second Surface | Partial |
| Comparative Example 5 | #4 | Worst | — | — | — |
| Example 9 | #4 | Worst | 3M Tape | Second Surface | Partial |
| Comparative Example 6 | #5 | Best | — | — | — |
| Example 10 | #5 | Best | 3M Tape | Second Surface | Partial |
| Comparative Example 7 | #5 | Worst | — | — | — |
| Example 11 | #5 | Worst | 3M Tape | Second Surface | Whole |

TABLE 4

(Measurement Result Of Experiment Object 2)

| Measurement Sample | Display Condition | Embodiment Of Anti-Vibration Layer | Measurement Location | | | | | | | | |
|---|---|---|---|---|---|---|---|---|---|---|---|
| | | | P1 | P2 | P3 | P4 | P5 | P6 | P7 | P8 | P9 |
| #4 | Best | Comparative Example 4 | 15.10 | 16.20 | 9.46 | <0 | <0 | <0 | <0 | 0.69 | <0 |
| | | Example 8 | <0 | 3.39 | 0.36 | <0 | <0 | <0 | <0 | <0 | <0 |
| | Worst | Comparative Example 5 | 20.60 | 22.00 | 14.10 | <0 | <0 | <0 | 0.18 | 4.17 | <0 |
| | | Example 9 | 2.96 | 8.21 | <0 | <0 | <0 | <0 | <0 | <0 | <0 |
| #5 | Best | Comparative Example 6 | 16.90 | 12.90 | 11.20 | — | — | — | — | — | — |
| | | Example 10 | 7.58 | 9.51 | <0 | — | — | — | — | — | — |
| | Worst | Comparative Example 7 | 20.30 | 14.90 | 15.20 | <0 | — | — | — | — | — |
| | | Example 11 | 1.94 | 8.54 | <0 | <0 | <0 | <0 | <0 | <0 | <0 |

TABLE 5

(Condition Of Experiment Object 3)

| Embodiment Of Anti-Vibration Layer | Measurement Sample | Display Condition | Type Of Anti-Vibration Layer | Location Of Anti-Vibration Layer | Occupying Area Of Anti-Vibration Layer |
|---|---|---|---|---|---|
| Comparative Example 8 | #6 LCM | Best | — | — | — |
| Example 12 | #6 LCM | Best | 3M Tape | Second Surface | Partial |
| Comparative Example 9 | #7 LCM | Best | — | — | — |
| Example 13 | #7 LCM | Best | 3M Tape | Second Surface | Partial |

TABLE 6

(Measurement Result Of Experiment Object 3)

| Measurement Sample | Display Condition | Embodiment Of Anti-Vibration Layer | Measurement Location | | | | | | | | |
|---|---|---|---|---|---|---|---|---|---|---|---|
| | | | P1 | P2 | P3 | P4 | P5 | P6 | P7 | P8 | P9 |
| #6 LCM | Best | Comparative Example 8 | 13.00 | 11.90 | 5.69 | 5.29 | 0.43 | 4.32 | 2.53 | 4.27 | 7.09 |
| | | Example 12 | 6.38 | 4.29 | 3.84 | 0.43 | 2.11 | <0 | 1.28 | <0 | <0 |
| #7 LCM | Best | Comparative Example 9 | 10.60 | 12.30 | 6.72 | <0 | 1.82 | <0 | <0 | 3.89 | 3.16 |
| | | Example 13 | 3.23 | 6.79 | 1.62 | — | — | — | — | — | — |

Figure 5B:
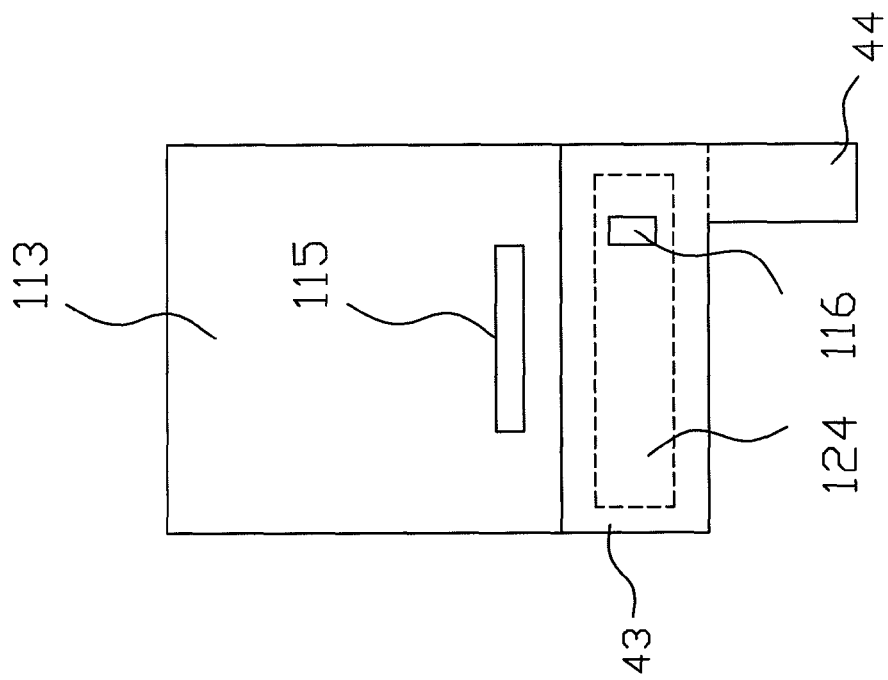
FIG. 5B shows a schematic top view of a display module for a mobile communication device according to one embodiment of the invention.
Figure 5A:
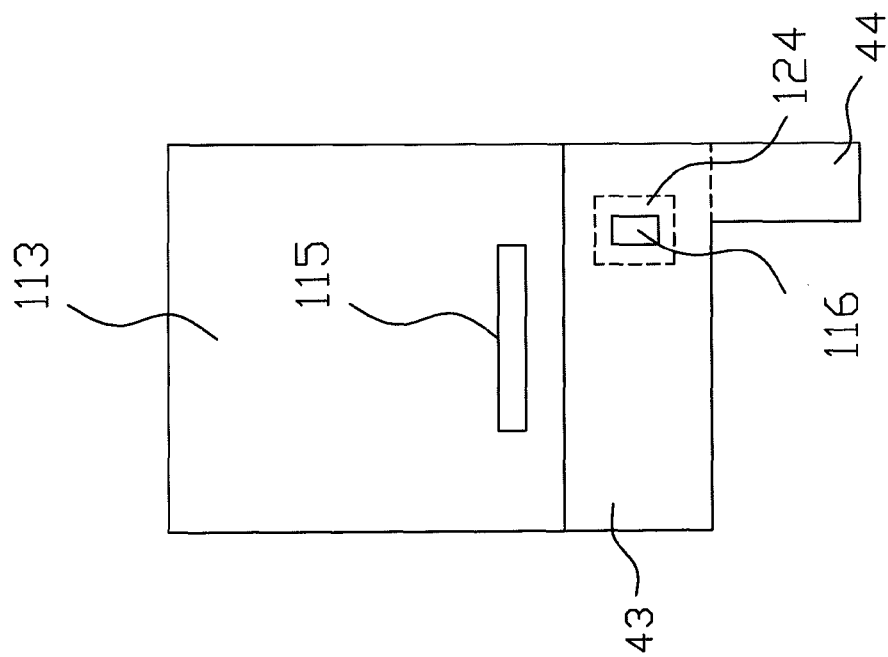
FIG. 5A shows a schematic top view of a display module for a mobile communication device according to one embodiment of the invention.
Figure 5C:
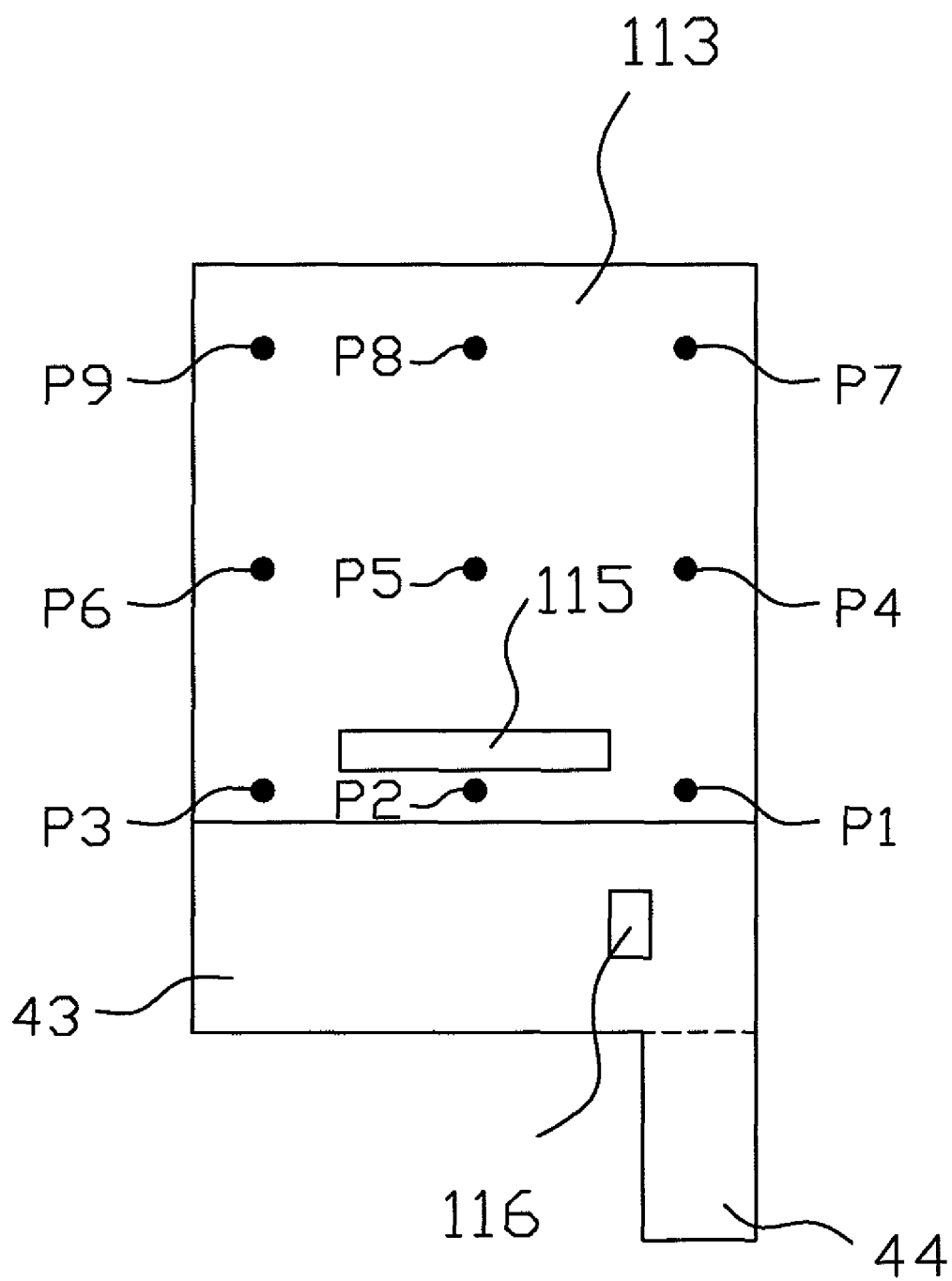
FIG. 5C shows a schematic top view of a display module for a mobile communication device illustrating different places for measuring noise according to one embodiment of the invention.

FIGS. 5A and 5B respectively show a schematic top view of a display module for mobile communication device according to one embodiment of the invention. Referring to FIG. 5A, the term "partial" used in the tables is to indicate that the anti-vibration layer 124 is disposed on a part of the coupling portion 43 of the FPCB 14, and the electronic component 116 is disposed in the orthographic projection area S of the anti-vibration layer 124 on the first surface 42 along the normal direction thereof. Referring to FIG. 5B, the term "whole" used in the tables is to indicate that the anti-vibration layer 124 is disposed on most of the area of the coupling portion 43 of the FPCB 14. FIG. 5C shows a schematic top view of a display module for mobile communication device illustrating different places where noise is measured according to one embodiment of the invention. Referring to FIG. 5C together with table 2, table 4, and table 6, a device can be graded pass or conditional pass (margin pass), if the measurement value thereof is lower than 5db (pass) or between 5db-10db (margin pass).

According to the specification of noise measurement, measuring noise should be conducted under the following conduction: (1) the broad band noise level of the background noise exceeds 10dB(A) ref 20μPa at the frequency between 20 Hz and 20 kHz or 5dB(A) ref 2μPa at the frequency larger than 1 kHz; (2) there is no peak in the broad band noise level of the background noise. The measurement device used should conform to IEC (International Electro technical Commission) 651 and have frequency resolution of at least 5 Hz at the frequency span between 20 Hz and 16 kHz. The measurement device has to be capable of measuring the single tone sound pressure as small as 5dB ref 2μPa. In practice, the measurement device may include a microphone and a computer. The microphone is disposed at a distance 5 millimeter above the display module for mobile communication device to be measured, and the computer including a measurement card for spectrum analyzer (such as FFT-analysator) receives data of noise volume from the microphone. In addition, the measurement device should be calibrated on the basis of IEC942 before and after measurement.

Referring to table 1 and table 2, experiment object 1 is to obtain measurement results under different provision conditions of the anti-vibration layer 124.

According to comparative example 1, example 1 and example 2, it is understood that the display module for mobile communication device 100 has less effect of reducing noise if both the anti-vibration layer 124 and the electronic component 116 are disposed on the first surface 42; the device 100 has more effect of reducing noise if the anti-vibration layer 124 is disposed on second surface 41 and the electronic component 116 is disposed on the first surface 42.

According to comparative example 1, example 1 and example 5, it is understood that the display module for mobile communication device 100 has effect of reducing noise if the anti-vibration layer 124 is disposed on a part of the coupling portion 43 of the FPCB 114 or on most of the coupling portion 43 of the FPCB 14. According to comparative example 1, example 1 and example 5; comparative example 2 and example 6; and comparative example 3 and example 7, it is understood that the display module for mobile communication device 100 has effect of reducing noise even though different samples (display module) is used; different kinds of the anti-vibration layer 124 is used; or the anti-vibration layer 124 is disposed on a part or most of the coupling portion 43 of the FPCB 14.

According to comparative example 1, example 2, example 3 and example 4, it is understood that the display module for mobile communication device 100 has effect of reducing noise even though different kinds of adhesive tapes are used as the anti-vibration layer 124. The adhesive tape maybe a transparent and cold resistant OPP adhesive tape (DEER BRAND), a double sided adhesive tape (DEER BRAND), an adhesive tape for electric equipment (TOYO), a crepe adhesive tape (GLOBE TAPE) or a 3M Scotch Super Clear adhesive tape (3M).

In addition, the measurement condition of examples 2 to 7 is that the display module for mobile communication device 100 is in a best display mode. According to examples 2 to 7, the display module also has effect of reducing noise volume by 3db to 5db.

Referring to table 3 and table 4, the swelling or shrinking deformation of the electronic components 116 (such as capacitor) are different in the best and worst display modes. Experiment object 2 is to obtain the measurement results in different (the best and worst) display modes where different kinds of adhesive tapes are used.

According to comparative examples 4-7 and examples 8-11, it is understood that the display module for mobile communication device 100 has effect of reducing noise in the both best and worst display modes. In particular, the display module for mobile communication device 100 can reduce the noise volume by 6db to 19db in the worst display mode.

Referring to table 5 and table 6, experiment object 3 is to obtain the measurement results that noise is mainly generated from the electronic component 116. According to comparative example 8 and example 12; comparative example 9 and example 13, it is understood that the display in which the anti-vibration layer 124 is provided has effect of reducing noise.

TABLE 7

| Trade Name Or Number | Thickness mm | Adhesive Force N/cm | gf/ 25 mm | Tension N/cm | Kgf/ 25 mm | Elongation Ratio % | Effect |
|---|---|---|---|---|---|---|---|
| 6131 | 0.090 | 3.2 | 800 | 4 | — | — | Pass |
| 791 | 0.060 | 1.6 | 200 | 10 | 2.5 | 50 | Pass |
| 761 | 0.045 | 2.0 | 500 | 24 | 6.0 | 100 | Not Pass |
| 210 | 0.12 | | | 31 | 3.5 | 6.0 | Not Pass |
| | 0.15 | 1.6 | 300 | | 4.0 | 7.0 | |
| | 0.18 | 1.8 | 350 | | 4.8 | 8.0 | |
| | 0.20 | | | | 5.3 | 9.0 | |

Table 7 shows the measurement results from experiments in which the adhesive tapes under a trade name or number 6131, 791, 761, and 210 made by DEER BRAND are used. According to table 7, it is understood that the display module for mobile communication device 100 has more effect of reducing noise if the tension of the tape is no more than 10 N/cm; it has less effect of reducing noise if the tension of the tape is between 10 N/cm and 24 N/cm. As a result, it is understood that the display module may have effect of reducing noise if the adhesive tape used has less extensibility.

FIG. 6A shows a schematic top view of a display module for mobile communication device according to one embodiment of the invention. FIG. 6B shows a schematic side view of a display module for mobile communication device according to one embodiment of the invention. The display module for mobile communication device 100a in FIGS. 6A and 6B is similar to the display module for mobile communication device 100 in FIG. 4, and therefore the same numerical reference designates the same member in these apparatus and the descriptions of the same members will be omitted. Only the difference between these apparatus will be described in the followings. In this embodiment, the display module for mobile communication device 100a may not include the anti-vibration layer 124. In order to be convenient to explain this embodiment, the FPCB 114 is divided into a first portion 141 and a second portion 142. The second portion 142 is a part of the FPCB 114 to which the electronic component 116 corresponds, and the first portion 141 is the part of FPCB 114 another than the second portion 142.

Referring to FIGS. 6A and 6B, the location of the electronic component 116 corresponds to that of the second portion 142 of the FPCB 114 and the electronic component 116 is disposed on the first surface 42 of the FPCB 114. Specifically, the orthographic projection area A of the electronic component 116 on the first surface 42 along the normal direction of the first surface 42 is at least partially overlapped into the second portion 142 of the FPCB 114. In this embodiment, the orthographic projection area A of the electronic component 116 is in the second portion 142 of the FPCB 114. The extensibility of the second portion 142 of the FPCB 114 is smaller than that of the first portion 141 of the FPCB 114 so that the display module for mobile communication device 100a may reduce the resonance due to vibration of the FPCB 14 to achieve the effect of reducing noise.

FIG. 7A shows a schematic top view of a display module for mobile communication device according to one embodiment of the invention. FIG. 7B shows a schematic side view of a display module for mobile communication device according to one embodiment of the invention. The display module for mobile communication device 100b in FIGS. 7A and 7B is similar to the display module for mobile communication device 100 in FIG. 4, and therefore the same numerical reference designates the same member in these apparatus and the descriptions of the same members will be omitted. Only the difference between these apparatus will be described in the followings. In this embodiment, the display module for mobile communication device 100b further includes an additional layer 134 in the FPCB 114. One manufacturing method of providing the additional layer 134 into the FPCB 114 is described as follows. In a manufacturing step of making the FPCB 114, the additional layer 134 is formed at the predetermined location on the first surface 42 where the electronic component 116 is to be disposed. For the sake of discussion, the portion of the FPCB 114 where the additional layer 134 is formed is called the second portion 142 hereafter. In this embodiment, the second portion 142 includes the additional layer 134 so that extensibility of the second portion 142 of the FPCB 114 is smaller than the first portion 141 of the FPCB 114. Material of the additional layer 134 used may be the same as that of the first portion 141 of the FPCB 114, that is, the same as material of the FPCB 114 in the FIG. 4B. In one preferred embodiment, extensibility of the material of the additional layer 134 used may be smaller than that of the first portion 141 of the FPCB 114. Since the location of the additional layer 134 is between the electronic component 116 and the first surface 42 and corresponds to the location of the electronic component 116, the resonance due to vibration of the FPCB 14 may be reduced. In another preferred embodiment, the provision location of the additional layer 134 may correspond to that of the anti-vibration layer 124. The electronic component 116 may further disposed in one surface area of the additional layer 134, so that both of the additional layer 134 and the electronic component 116 are located in the orthographic projection area S of the anti-vibration layer 124 on the first surface 42.

Figure 8:
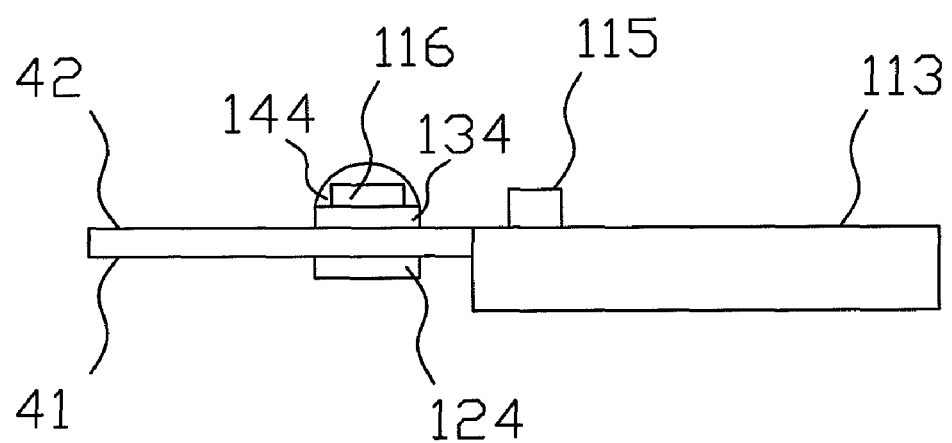
FIG. 8 shows a schematic side view of a display module for a mobile communication device according to one embodiment of the invention.

FIG. 8 shows a schematic side view of display module for a mobile communication device according to one embodiment of the invention. The display module for mobile communication device 100c in FIG. 8 is similar to the display module for mobile communication device 100b in FIGS. 7A and 7B, and therefore the same numerical reference designates the same member in these apparatus and the descriptions of the same members will be omitted. Only the difference between these apparatus will be described in the followings. In this embodiment, the display module for mobile communication device 100c further includes a clad layer 144. The clad layer 144 is used to wrap the electronic component 116 so that deformation of the electronic component 116 can be suppressed. Accordingly, the resonance due to vibration of the FPCB 14 is reduced and then the effect of reducing noise is also achieved.

In operation of the display modules for mobile communication device 100, 100a, 100b and 100c, the optical characteristics of the liquid crystal in display panel is changed by a driving voltage. However, during the change of the driving voltage, dielectric components of the capacitor in the FPCB are affected so that the capacitor 16 swells and shrinks. The FPCB 14 vibrates with the swelling or shrinking of the capacitor 16, and then the resonance is formed which is noise for human ear. The present invention is to solve the problem.

According to deliberate analysis of related experiments, it is found that the anti-vibration layer 124 may alleviate the force caused by the deformation of the electronic component 116 on the FPCB so that the resonance is reduced. As a result, the noise is decreased. The unexpected result is achieved, which indicates that the present invention has outstanding technical features and can achieve remarkable effects. Furthermore, the anti-vibration layer 124 may be implemented by an adhesive tape according to an embodiment of the invention. This technique, different from the technique used to solve this kind of problems by prior art, alters the concept of original design and simplified the complexity of manufacture process.

Although the preferred embodiments of the present invention has been fully described by way of examples with reference to the accompanying drawings, it should not be construed as any limitation on the implementation range of the invention. Various equivalent changes and modifications can be performed by those who are skilled in the art without deviating from the scope of the invention. The scope of the present invention is to be encompassed by the claims of the present invention. Any embodiment or claim of the present invention does not need to reach all the disclosed objects, advantages, and uniqueness of the invention. Besides, the abstract and the title are only used for assisting the search of the patent documentation and should not be construed as any limitation on the implementation range of the invention.

What is claimed is:

1. A display module for mobile communication device comprising:
   a display panel;
   a flexible printed circuit board, coupled to the display panel, including a first flexible printed circuit board portion and a second flexible printed circuit board portion connected to the first flexible printed circuit board portion; and
   an electronic component capable of being deformed by a driving voltage, disposed on a first surface of the flexible printed circuit board, wherein an orthographic projection area on the first surface of the electronic component is at least partially overlapped with the second flexible printed circuit board portion,
   wherein the extensibility of the second flexible printed circuit board portion of the flexible printed circuit board is smaller than the extensibility of the first flexible printed circuit board portion of the flexible printed circuit board so that the vibration of the flexible printed circuit board due to the deformation of the electronic component is reduced.

2. The display module for mobile communication device according to claim 1, wherein the orthographic projection area on the first surface of the electronic component is located within the second flexible printed circuit board portion of the flexible printed circuit board.

3. The display module for mobile communication device according to claim 1, wherein the second flexible printed circuit board portion of the flexible printed circuit board further comprises an additional layer.

4. The display module for mobile communication device according to claim 3, wherein the material of the additional layer is the same as the material of the first flexible printed circuit board portion of the flexible printed circuit board.

5. The display module for mobile communication device according to claim 3, wherein the extensibility of the additional layer is smaller than the extensibility of the first flexible printed circuit board portion of the flexible printed circuit board.

6. The display module for mobile communication device according to claim 3 further comprising a clad layer, for wrapping the electronic component to suppress deformation of the electronic component, whereby the resonance due to vibration of the flexible printed circuit board is reduced.

7. The display module for mobile communication device according to claim 1, further comprising a anti-vibration layer disposed on the second surface of the second flexible printed circuit board portion.

8. The display module for mobile communication device according to claim 7, wherein the electronic component is located within an orthographic projection area on the first surface of the anti-vibration layer.

9. The display module for mobile communication device according to claim 7, wherein the anti-vibration layer comprises an adhesive tape.

10. A display module for mobile communication device comprising:
    a display panel;
    a flexible printed circuit board, coupled to the display panel, including a first flexible printed circuit board potion and a second flexible printed circuit board portion connected to the first flexible printed circuit board portion, wherein the second flexible printed circuit board portion includes:
    a first surface;
    a second surface opposite the first surface; and
    an anti-vibration layer, disposed on the second surface of the second flexible printed circuit board portion; and
    an electronic component capable of being deformed by a driving voltage, disposed on the first surface of the second flexible printed circuit board portion,
    wherein the area of the first surface where the electronic component is disposed at least partially overlapped with an orthographic projection area on the first surface of the anti-vibration layer, so that the vibration of the flexible printed circuit board due to the deformation of the electronic component is reduced.

11. The display module for mobile communication device according to claim 10, wherein the electronic component is located within the orthographic projection area on the first surface of the anti-vibration layer.

12. The display module for mobile communication device according to claim 10, wherein the anti-vibration layer comprises an adhesive tape.

13. The display module for mobile communication device according to claim 12, wherein the tension of the adhesive tape is smaller than 10 N/cm.

14. The display module for mobile communication device according to claim 10, further comprises an additional layer, located in the electronic component correspondingly, and the additional layer is disposed between the electronic component and the first surface.

15. The display module for mobile communication device according to claim 14, wherein the electronic component is disposed within an area of the surface of the additional layer.

16. The display module for mobile communication device according to claim 15, wherein the additional layer and the electronic component is located within an orthographic projection area on the first surface of the anti-vibration layer.

17. The display module for mobile communication device according to claim 10 further comprising a clad layer, for wrapping the electronic component to suppress deformation of the electronic component.

* * * * *